(12) United States Patent  (10) Patent No.: US 7,123,032 B2
Yakymyshyn et al.  (45) Date of Patent: *Oct. 17, 2006

(54) VOLTAGE SENSOR AND DIELECTRIC MATERIAL

(75) Inventors: Christopher Paul Yakymyshyn, Seminole, FL (US); Pamela Jane Yakymyshyn, Seminole, FL (US); Michael Allen Brubaker, Loveland, CO (US)

(73) Assignee: FieldMetrics, Inc., Seminole, FL (US)

( * ) Notice: Subject to any disclaimer, the term of this patent is extended or adjusted under 35 U.S.C. 154(b) by 10 days.

This patent is subject to a terminal disclaimer.

(21) Appl. No.: 10/904,899

(22) Filed: Dec. 3, 2004

(65) Prior Publication Data

US 2005/0122122 A1  Jun. 9, 2005

Related U.S. Application Data

(60) Provisional application No. 60/481,739, filed on Dec. 4, 2003.

(51) Int. Cl.
*G01R 27/08* (2006.01)

(52) U.S. Cl. ...................... 324/705; 324/713

(58) Field of Classification Search ............... 324/126, 324/133, 665, 672, 705, 713
See application file for complete search history.

(56) References Cited

U.S. PATENT DOCUMENTS

| | | | | |
|---|---|---|---|---|
| 3,991,367 A | | 11/1976 | Chapman | 324/133 |
| 4,259,666 A | * | 3/1981 | Takahashi et al. | 340/647 |
| 4,904,931 A | | 2/1990 | Miller | 324/96 |
| 4,950,979 A | | 8/1990 | Stegmuller | 324/126 |
| 5,017,859 A | | 5/1991 | Engel | 324/127 |
| 5,077,520 A | | 12/1991 | Schweitzer | 324/133 |
| 5,473,244 A | * | 12/1995 | Libove et al. | 324/126 |
| 5,729,888 A | * | 3/1998 | Abdelgawad et al. | 29/602.1 |
| 5,796,296 A | | 8/1998 | Krzentz | 327/545 |
| 5,883,508 A | | 3/1999 | Ermisch | 323/359 |
| 6,380,725 B1 | | 4/2002 | Chavez | 324/96 |
| 6,456,094 B1 | | 9/2002 | Kuperman | 324/676 |
| 6,677,743 B1 | | 1/2004 | Coolidge | 324/126 |
| 6,717,395 B1 | * | 4/2004 | Skendzic et al. | 324/117 R |

* cited by examiner

*Primary Examiner*—Walter Benson

(57) ABSTRACT

A voltage sensor is described that consists of an arrangement of impedance elements. The sensor is optimized to provide an output ratio that is substantially immune to changes in voltage, temperature variations or aging. Also disclosed is a material with a large and stable dielectric constant. The dielectric constant can be tailored to vary with position or direction in the material.

7 Claims, 2 Drawing Sheets

VOLTAGE SENSOR AND DIELECTRIC MATERIAL

CROSS REFERENCE TO PRIOR APPLICATION

This application claims the priority of U.S. Provisional Application Ser. No. 60/481,739 filed Dec. 4, 2003 and entitled "VOLTAGE SENSOR AND DIELECTRIC MATERIAL", the subject matter of which is incorporated herein by reference.

FEDERAL GOVERNMENT STATEMENT

This invention was made with Government support under contract DE-FG03-01 ER83228 awarded by the Department of Energy. The Government has certain rights to this invention.

FIELD OF THE INVENTION

The present invention relates to a voltage sensor for measuring voltage such as the voltage of a high-voltage power transmission line. The present invention also relates to an insulating material for use in electrical apparatus where the material is required to have stable dielectric properties when exposed to an electric field.

DESCRIPTION OF THE PRIOR ART

A variety of high-voltage measurement techniques are known in the art, including voltage transformers, capacitive voltage transformers, resistive voltage dividers, capacitive voltage dividers, mixed resistive-capacitive voltage dividers, electric field point sensors, line integral optical voltage sensors and distributed electric field point sensors. U.S. Pat. No. 4,950,979, issued Aug. 21, 1990, discloses a resistive divider voltage sensor integrated into an insulating member. U.S. Pat. No. 5,796,296, issued Aug. 18, 1998 discloses a combined resistance-capacitance voltage divider circuit, wherein the resistors are connected in parallel with the capacitors, and the ratio of capacitors are set equal to the ratio of resistors to effect an accurate response over a broad bandwidth. U.S. Pat. No. 5,883,508, issued Mar. 16, 1999, discloses an ohmic resistive divider consisting of a single resistive element with taps, combined with capacitive shielding elements to compensate for ambient electromagnetic effects. U.S. Pat. No. 6,677,743, issued Jan. 13, 2004, discloses a voltage sensor using a plurality of voltage sensing devices spaced peripherally around a housing. U.S. Pat. No. 5,017,859 discloses a capacitive divider to measure voltage of a bus bar using a precisely controlled mechanical fixture. U.S. Pat. No. 5,077,520, issued Dec. 31, 1991, discloses a capacitive divider high impedance voltage indicator using a liquid crystal display as one of the capacitors in the divider. U.S. Pat. No. 6,456,094, issued Sep. 24, 2002, discloses a capacitive voltage divider consisting of a first capacitive divider, connected to a second capacitive divider, with additional resistance connected in parallel with the second capacitive divider to affect an improved response to long pulse duration voltage waveforms. U.S. Pat. No. 6,380,725, issued Apr. 30, 2002, discloses resistive shielding for a voltage sensor using at least one discrete electric field sensor. U.S. Pat. No. 3,991,367, issued Nov. 9, 1976, discloses a method for detecting the potential of a high-voltage transmission line using a capacitively coupled pickup electrode mounted in a suspension insulator and coupled through a rectifier circuit to a neon indicator. U.S. Pat. No. 4,904,931, issued Feb. 27, 1990, discloses an optical voltage sensor that uses a longitudinal Pockets cell connected between two conductors, and two optical signals with a phase shift between them to allow accurate reconstruction of the applied voltage between the two conductors.

The above-referenced prior art has one or more limitations in measurement performance, size, safety and cost. Inductive voltage transformers and capacitive voltage transformers use insulating polymeric solids, insulating oil or sulfur hexafluoride gas for insulation, resulting in a heavy or expensive device. Resistive voltage dividers must have a high electrical resistance to avoid excessive heating of the device. The high resistance causes the divider ratio to become very sensitive to external perturbations of the electric field distribution along the divider structure. The high resistance, when combined with the distributed capacitance of the structure, causes the high frequency response of the device to be limited. Capacitive voltage dividers can fail catastrophically if the elements comprising the divider fail in the short circuit condition. Large voltage transients with respect to time, or dV/dt, can cause a pure capacitive divider to fail because of the large displacement current that flows through the device. Electric field point sensors measure charge rather than potential, and their calibration is very sensitive to external perturbations of the electric field near the sensor. Line integral optical voltage sensors are physically small to keep costs affordable, and as a result they require insulating fluids and expensive housings to support the large electric fields near the sensor element. Distributed electric field point sensors provide a piece-wise approximation to the line integral voltage sensor, but require an operating environment that will not perturb the electric field distributions in close proximity to the individual sensor elements. For example, water vapor condensing on the electric field sensor will cause large errors in measurement. An expensive and continuously monitored housing is required to maintain the dry, insulating environment required for this approach.

A number of methods have been disclosed in the prior art to fabricate a solid material with superior dielectric properties. It is generally desired to have a solid dielectric with a large dielectric constant, a low loss tangent and a high resistivity. These properties should remain stable over wide temperature variations. When used as a dielectric material in a high voltage apparatus, the dielectric should have high dielectric breakdown strength, and a graceful failure mechanism to avoid catastrophic failure if internal arcing occurs. In addition, sometimes it is desired to adjust the dielectric constant as a function of direction in the solid, or adjust the dielectric constant as a function of the spatial location in the solid or on the surface of the solid.

Ceramic materials such as Barium Titanate or Barium Niobate have dielectric constants that vary substantially over temperature. They have high loss tangents and they do not gracefully fail. Composite materials comprised of a polymer or ceramic host and powdered filler with a high dielectric constant have large temperature dependencies, high loss tangents, poor stability over time, and a reduced dielectric constant compared to the filler's dielectric constant. Single crystals of high dielectric constant materials such as Barium Titanate have dielectric constants that vary with direction in the crystal, but they are not easily adjustable. Single crystals are also very expensive and difficult to machine to a desired shape.

SUMMARY OF THE PRESENT INVENTION

An objective of the present invention is to produce a high voltage sensor that simultaneously offers a wide frequency response, high accuracy of magnitude and phase angle measurements, a low weight, low cost, simple structure, insensitivity to external electric field perturbations, and robustness against high voltage transients such as lightning transients.

Briefly, a first aspect of the invention is a voltage sensor that uses a plurality of impedances connected in series to form a string between two conductors at different electrical potentials. An output signal is provided by measuring the voltage across one of the impedance elements at one or both ends of each string. In the preferred embodiment of the invention, the impedance element is comprised of a resistor electrically connected in series with a capacitor.

The present invention reduces the deficiencies inherent in existing high voltage sensor technologies.

The invention eliminates the need for insulating oil and sulfur hexafluoride gas, resulting in a lighter weight device with little or no maintenance required.

The invention provides a voltage measurement that is insensitive to temperature changes.

The invention provides a voltage measurement that is insensitive to variations in the electric field distribution near the device.

The invention can achieve measurement accuracies of 0.1% in amplitude, and 0.03 degrees in phase angle for an AC voltage applied to the invention.

The invention is able to handle high values of dV/dt voltage transients without failing.

The signal bandwidth of the invention can be made large, extending from less than 1 Hz to greater than 1 MHz.

The invention can be scaled to a variety of voltages by adjusting the number of impedance elements in the design.

A second aspect of the invention is a dielectric material consisting of an interconnected matrix of impedance elements that is subsequently encapsulated in a solid insulating material such as epoxy. One or more surfaces of the solid have attached electrodes. The dielectric properties of the resulting heterogeneous solid are controlled by the characteristics of the individual impedance elements, the interconnection pattern of the elements, and the distribution pattern of the values of the impedance elements. The disclosed dielectric material has utility as a shielding material to adjust the electric field distribution surrounding the material in a determinate manner.

The present invention eliminates many of the drawbacks of existing dielectric materials for high voltage apparatus.

An advantage of the present invention is that the dielectric material can have a large dielectric constant.

Another advantage of the present invention is that the dielectric material properties do not vary appreciably over temperature or time.

Another advantage of the present invention is that the dielectric strength can be high.

Another advantage of the present invention is that by using polymeric film/foil capacitors in the individual impedance elements, the dielectric has a graceful failure mode when internal dielectric breakdown occurs.

Another advantage of the present invention is that the dielectric can have a dielectric constant that varies in a designated manner as a function of direction in the solid.

Another advantage of the present invention is that the dielectric can have a dielectric constant that varies in a designated manner as a function of position in the solid or on the surface of the solid.

DETAILED DESCRIPTION OF THE PREFERRED EMBODIMENTS

Figure 1:
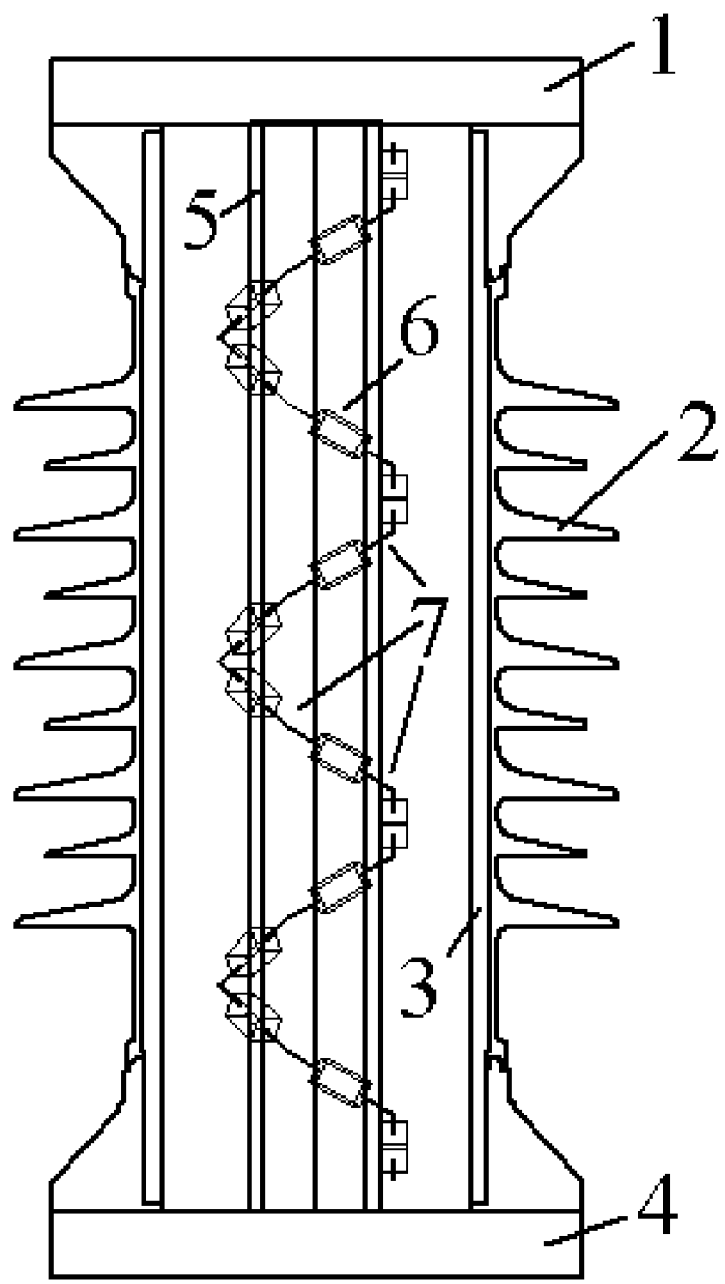
FIG. 1 is a schematic diagram of the voltage sensor mechanical assembly.

A voltage sensor is described (shown in FIG. 1) that uses a plurality of impedances 6 connected in series between two conductors 1 and 4 at different electrical potentials. An output signal is provided by measuring the voltage across one of the impedance elements at one or both ends of each string. The impedances 6 are selected to meet particular performance criteria that depend on the application of the divider. The sensor consists of one or more strings of impedances 7 that are fastened to an insulating support tube 5. The divider structure is contained within an insulating housing 3 made from porcelain or polymer with weather sheds 2 on the exterior surface. The strings are distributed in an optimal fashion for voltage grading, with the preferred embodiments being straight sections, or coiled shapes having cross sections including but not limited to circular or square. Each string starts at a different angular location at the top of the tube. For example, if two strings are used, then the starting locations are located 180 degrees apart at the top of the tube. For n strings, the starting locations are spaced by 360/n degrees. The total number of elements in the string is determined by the maximum allowed voltage across the divider, divided by the maximum allowed voltage across each impedance element. The coil shape, pitch, diameter, total number of rotations, impedance element length and cross-sectional area of the single or multiple strings are inter-related. The claimed invention selects these parameters to uniformly grade the voltage potential between the two conductors over a wide range of frequencies.

Equipment used for power distribution and transmission applications in the electric utility industry must meet strict type testing requirements defined in ANSI C57.13, IEC 60044.7, and IEC 60044.8, among other standards. These standards define the basic insulation level (BIL) of the complete device. Both 60 Hz applied voltage tests and lightning impulse voltage tests are required for all devices, and switching surge voltage tests are also required for higher voltage class equipment. To meet all of these test requirements, the electric field in the region between the two conductors must not exceed the threshold required to initiate an electrical discharge, as this can cause equipment failure. The electric field amplitude and distribution must therefore remain well controlled for both 60 Hz voltages and lightning impulse voltages having significant energy carried by frequency components above 100 kHz.

The present invention achieves this grading by placing a capacitive and a resistive element in series to form an impedance element that is the building block for the impedance string or strings within the divider structure. The capacitive element is selected to sustain a high 60 Hz AC voltage across its terminals, while the resistor element is selected to handle the average power dissipated with a 60 Hz voltage applied. The resistor element is also selected to withstand the peak voltage experienced during the application of a lightning impulse, to safely absorb the total energy contained in the lightning impulse, and to limit the time rate of voltage change across the capacitor. The capacitor is selected to safely carry the peak currents associated with the lightning impulse voltage waveform with the series resistor in place. The capacitor can be specified by the maximum allowed time derivative of the applied voltage (dV/dt), since this is related to the peak current capability of the capacitor by $I=C \, dV/dt$, where C is the capacitance of the capacitor.

In one embodiment of the invention, the impedance element consists of a polymeric film capacitor having values ranging from 10 pico-Farads to 10 micro-Farads, in series with an encapsulated, wire-wound resistor having a value between 100 Ohms and 10,000 Ohms. This selection provides excellent voltage grading between the two conductors over a wide range of frequencies.

The voltage divider can be used to accurately measure the voltage between two conductors. This is accomplished by monitoring the voltage across one or more of the impedance elements, which is smaller than the applied voltage by $V1=Vo*Z1/Ztotal$, where Z1 is the impedance across which the measured voltage V1 appears, Vo is the applied voltage between the two conductors, and Ztotal is the total impedance of the impedance string or strings. Z1 can be one or more of the impedance elements that make up the string or strings. Since the elements all have identical thermal coefficient of impedance, voltage coefficient of impedance and long term drift, the divider ratio will be substantially unaffected by temperature, applied voltage and aging.

In addition to measuring the magnitude of a voltage, the voltage divider must also maintain accurate phase angle between the applied voltage and the measurement signal. The magnitude and phase of the measurement are affected by external objects coupling to the impedance string or strings through the air, by voltages existing on additional nearby conductors, and by a low input impedance of the electronic circuitry that is connected to the output of the divider. Each of these effects must be considered in the design of the divider.

The divider structure is contained within an insulating housing 3 made from porcelain or polymer with weather sheds 2 on the exterior surface. Semi-conductive coatings such as melting ice, pollution or salt water deposited onto the sheds can severely distort the voltage distribution near the divider. External objects such as other electrical conductors at different voltages or support structures at ground potential can capacitively couple to the impedance string or strings, resulting in a change in the divider ratio. This is a common source of error for impedance dividers.

To minimize these effects, the insulator housing 3 can be made with a large diameter to physically move the sources of perturbations away from the divider. The ratio of the insulator length to the insulator diameter should preferably be in the range of 0.05 to 20. As an alternative or additional measure, the impedance of the complete device can be reduced as much as possible, provided the power dissipation in the impedance string or strings does not become excessively high while voltage is placed across the sensor. The use of multiple strings effectively provides this, even when the strings are not electrically connected to the same circuitry at each end of the tube. For example, a tube with two identical strings can have one string connected as a voltage divider with ratio R1, and the second string connected as a voltage divider with ratio R2. The capacitive coupling between strings is small and does not significantly change the individual string ratios. However, each string shields the other from external perturbations by halving the impedance between the two conductors.

Figure 2:
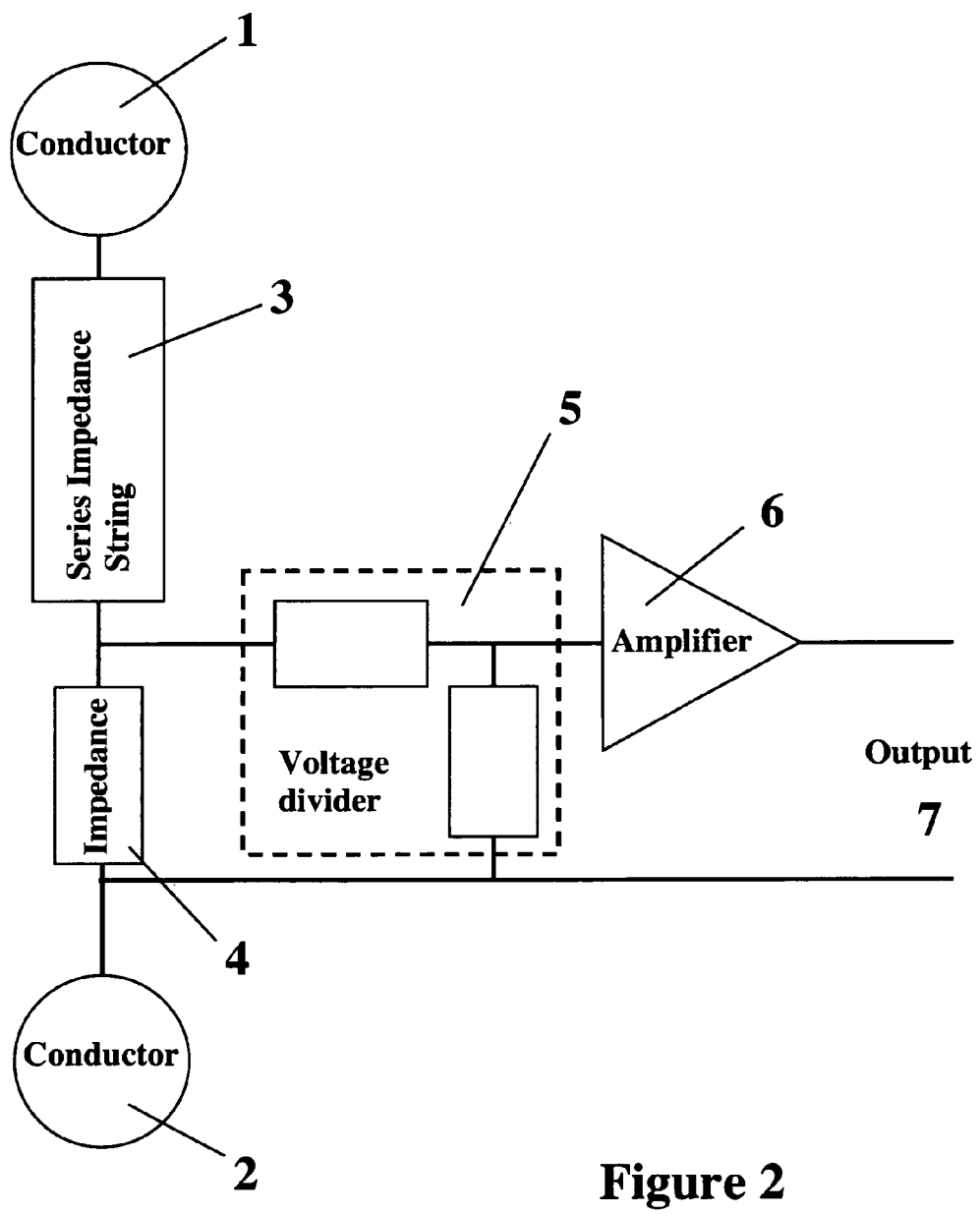
FIG. 2 is a schematic diagram of the equivalent circuit of the voltage sensor.

FIG. 2 is a block diagram of the voltage sensor, including the amplifier. The two conductors 8 and 9 have connected between them a series impedance string 10 (identified as Ztotal-Z1) in series with a single impedance element 11 (identified as Z1). A second voltage divider 12 can be formed using two impedance elements with differing impedance values. The output of the second voltage divider 12 is amplified by an electronic amplifier 13 to generate a voltage across output terminals 14 that is an accurate representation of the voltage difference between conductors 8 and 9.

The input impedance of the electronic amplifier 13 and the second voltage divider 12 are in parallel with the single impedance element 11, changing the voltage across the single impedance element and altering the divider ratio. The phase error introduced by this loading can be compensated by either using an amplifier with a very high input impedance Z (where $Z>1000*Z1$), a very high impedance in the second voltage divider 12, or by adjusting Z1 to compensate for the additional input impedance in parallel with impedance element 11. In many cases it is difficult to have high input impedances, since often the second resistive divider is required to reduce the voltage to a level suitable for use with conventional electronic amplifiers. For the case of a string of impedance elements comprised of a resistor in series with a capacitor, the impedance element Z1 has been modified to be a capacitor in series with an optimized value of the resistor. The resulting output signal has a ratio of more than 1000:1 and a phase error of <0.1 degrees.

The invention has been reduced to practice for two impedance strings configured as interwoven coils with the following results. The ratio magnitude and phase angle remains stable to within +/−0.2% over a temperature range of −40 to +80 degrees Celsius. The ratio is changed by 0.05% when a large conductive, grounded plate is situated three feet from the device. The ratio changes by 0.1% when aluminum foil sheets are placed on sections of the insulator sheds to severely distort the electric field distribution. The ratio remains stable to 0.1% over a wide range of voltages from 100 VAC to 25,000 VAC. The device passes dielectric type testing including wet and dry AC withstand, full and chopped lightning impulse and partial discharge tests required for various power distribution and transmission applications. All tests were performed in accordance with IEEE Standard 4-1995.

The device scales to higher voltages by stacking lower voltage units on top of each other or by extending the length of the impedance divider structure and insulator housing. In either case, external corona shields are required to reduce electric fields near the divider impedance string(s).

For some applications, the voltage can be monitored across one or more impedance elements on each end of the impedance string. This allows measurement of the voltage between the two conductors by electronic circuits located and electrically connected to each conductor. For other applications, the output of the amplifier circuit can feed an additional power amplifier (with an output power capability of >50 Volt-Amperes) that can directly control an electromechanical relay commonly used in power utility systems.

The invention can also be used to form a bulk material with a large dielectric constant. In this case, the string or strings of series connected impedance elements are terminated at each end to a conductive plate. The strings are then immersed in a dielectric medium such as a gas, liquid or solid insulating or semi-conducting material. The resulting structure provides many of the properties desired in a bulk material having a large dielectric constant. For example, by selecting the impedance elements to have stable properties over temperature, time and applied voltage, the resulting bulk material also provides these properties.

By using individual strings, the bulk material will have a dielectric constant that is uni-axial. That is, the dielectric constant measured between the two conductive plates will differ substantially from that measured in a direction orthogonal to the axis of the string or strings. By interconnecting the substantially parallel strings along their lengths with additional impedance elements, a bulk material can be fabricated that has a large dielectric constant in a plurality of directions, or differing dielectric constants in selected directions.

An example of the properties that can be achieved is given below. A string of 100 capacitors with value 10 nF each are series connected and formed into a coil with a circular cross-section. The coil length is 100 cm. The impedance elements are embedded in an insulating epoxy to form a tube having an inside diameter of 5 cm and an outside diameter of 10 cm. Metallic electrodes are fastened to the ends of the tube. The resulting capacitance between the two electrodes is 0.1 nF. If the tube were treated as a bulk material, then the relative dielectric constant of the bulk material would be epsilon=1919. By selecting good quality capacitors, the resulting dielectric constant is large, very stable over temperature, time and applied voltage, has a high dielectric strength and a low loss tangent. This combination of properties is impossible to achieve with conventional approaches such as high dielectric constant ceramic materials.

By adjusting the value of the impedance elements as a function of position in the string, the effective dielectric constant in sections of the bulk material can be adjusted to suit a particular application. For example, electric field shaping to provide a particular electric field amplitude distribution as a function of position along the bulk medium could be useful for certain high voltage equipment, where electric stresses must be maintained below a certain level. This approach could be utilized to make post insulators for the electric utility industry with significantly improved high voltage withstand capability, particularly in the presence of deposits on the external sheds resulting from pollution, ice, salt fog, etc.

What is claimed is:

1. A device to measure the voltage difference between two conductors, comprised of:
   a plurality of series-connected electrical impedance elements distributed in one or more high voltage impedance strings with one end of each string connected to a first conductor and the other end of each string connected to a second conductor;
   where the impedance element at one or both ends of one or more of the series-connected high voltage impedance element string or strings designated as the low voltage impedance element across which a voltage signal is measured;
   where the impedance string or strings are formed into one or more intertwined spirals extending between the two conductors such that each spiral-formed impedance string provides dielectric shielding for the other spiral-formed impedance strings;
   where each impedance element is comprised of at least one capacitor and one resistor connected in series;
   and where one or more electronic circuits amplify the signals across one or more of the low voltage impedance elements and provide corrections for one or more of the ratios between the measured voltage difference and one or more of the output signals.

2. The device in claim 1 where the impedance string or strings are formed into one or more intertwined spirals extending between the two conductors and creates a structure having a uniform grading of voltage along its length for 60 Hz and higher frequencies including power line harmonics and the impulse spectrum for both lightning and switching.

3. The device in claim 1 where the impedance element is a capacitor in series with a resistor, the capacitors are arranged on the inside of an insulating support tube and the resistors are arranged on the outside of the tube to provide mechanical support of the individual elements, and to provide electrical shielding of the leads on the individual components.

4. The device in claim 1 where the voltage coefficient(s) of impedance of the end element or elements is/are chosen to match the voltage coefficient of impedance for the high voltage impedance string or strings.

5. The device in claim 1 where the long-term drift(s) of impedance of the end element or elements is/are chosen to match the long-term drift of the high voltage impedance string or strings.

6. The device in claim 1 where the impedance(s) of the end element or elements is/are chosen to compensate for phase shifts in the divider output caused by the finite input impedance of additional circuitry connected across the low voltage element.

7. A voltage measurement structure comprised of two or more of the devices described in claim 1 that are stacked end to end to form a higher voltage device.

* * * * *